United States Patent [19]
Aguilera et al.

[11] Patent Number: 6,107,564
[45] Date of Patent: Aug. 22, 2000

[54] SOLAR CELL COVER AND COATING

[75] Inventors: John A. Aguilera; William H. Howard; Matthew E. Krisl, all of Santa Rosa, Calif.

[73] Assignee: Deposition Sciences, Inc., Santa Rosa, Calif.

[21] Appl. No.: 08/972,372

[22] Filed: Nov. 18, 1997

[51] Int. Cl.[7] .............................................. H01L 31/0216
[52] U.S. Cl. ...................... 136/257; 136/256; 204/192.26
[58] Field of Search ................................... 136/252, 256, 136/257; 250/226; 204/192.26, 192.27, 192.28, 298.26, 298.23, 298.24

[56] References Cited

U.S. PATENT DOCUMENTS

| | | | |
|---|---|---|---|
| 3,247,392 | 4/1966 | Thelen | 250/226 |
| 3,423,147 | 1/1969 | Thelen | 350/166 |
| 3,914,023 | 10/1975 | Thelen | 350/164 |
| 4,229,066 | 10/1980 | Rancourt et al. | 350/1.6 |
| 4,293,732 | 10/1981 | Rancourt et al. | 136/257 |
| 4,322,276 | 3/1982 | Meckel et al. | 204/192 P |
| 4,389,534 | 6/1983 | Winterling | 136/256 |
| 4,578,527 | 3/1986 | Rancourt et al. | 136/256 |
| 4,783,373 | 11/1988 | Baumeister et al. | 428/446 |
| 4,828,346 | 5/1989 | Jacobsen et al. | 350/1.7 |
| 5,086,351 | 2/1992 | Couput et al. | 359/265 |
| 5,122,250 | 6/1992 | Doormann et al. | 204/192.26 |
| 5,171,414 | 12/1992 | Amberger et al. | 204/192.26 |
| 5,216,542 | 6/1993 | Szczyrbowski et al. | 359/588 |
| 5,225,057 | 7/1993 | LeFebvre et al. | 204/192.13 |
| 5,427,629 | 6/1995 | Tanzilli et al. | 136/251 |
| 5,449,413 | 9/1995 | Beauchamp et al. | 136/257 |

*Primary Examiner*—Nam Nguyen
*Assistant Examiner*—Michael C. Miggins
*Attorney, Agent, or Firm*—Malcolm B. Wittenberg

[57] ABSTRACT

An ultraviolet and infrared reflecting coating with a wide transmission band and a solar cell cover on which the coating has been deposited. The coating contains a multi-layer bandpass filter, and some of the layers of this filter are comprised of mixed materials which have a selectable index of refraction. The design can be optimized by varying the index or refraction of at least one of the layers of mixed material.

10 Claims, 7 Drawing Sheets

| LAYER | MATERIAL | INDEX* | LAYER THICKNESS |
|---|---|---|---|
|  | CMX GLASS | 1.540 | (NM) |
| 1 | SiO2 | 1.460 | 0.0 |
| 2 | 52.3%SiO2-47.7%HfO2 | 1.757 | 81.0 |
| 3 | HfO2 | 2.100 | 133.2 |
| 4 | 57.1%SiO2-42.9%HfO2 | 1.726 | 74.4 |
| 5 | SiO2 | 1.460 | 140.0 |
| 6 | 60.1%SiO2-39.9%HfO2 | 1.706 | 70.3 |
| 7 | HfO2 | 2.100 | 116.0 |
| 8 | 54.0%SiO2-46.0%HfO2 | 1.746 | 61.7 |
| 9 | SiO2 | 1.460 | 156.8 |
| 10 | 60.1%SiO2-39.9%HfO2 | 1.706 | 70.3 |
| 11 | HfO2 | 2.100 | 99.3 |
| 12 | 53.0%SiO2-47.0%HfO2 | 1.752 | 64.3 |
| 13 | SiO2 | 1.460 | 143.7 |
| 14 | 54.9%SiO2-45.1%HfO2 | 1.740 | 63.6 |
| 15 | HfO2 | 2.100 | 102.5 |
| 16 | 49.8%SiO2-50.2%HfO2 | 1.773 | 60.7 |
| 17 | SiO2 | 1.460 | 153.1 |
| 18 | 52.2%SiO2-47.8%HfO2 | 1.758 | 60.4 |
| 19 | HfO2 | 2.100 | 105.2 |
| 20 | 54.4%SiO2-45.6%HfO2 | 1.743 | 62.1 |
| 21 | SiO2 | 1.460 | 149.2 |
| 22 | 51.3%SiO2-48.7%HfO2 | 1.763 | 63.3 |
| 23 | HfO2 | 2.100 | 104.2 |
| 24 | 51.9%SiO2-48.1%HfO2 | 1.759 | 66.5 |
| 25 | SiO2 | 1.460 | 166.0 |
| 26 | 63.8%SiO2-36.2%HfO2 | 1.683 | 94.3 |
| 27 | HfO2 | 2.100 | 13.6 |
| 28 | 65.0%SiO2-35.0%HfO2 | 1.675 | 97.0 |
| 29 | SiO2 | 1.460 | 177.5 |
| 30 | 69.0%SiO2-31.0%HfO2 | 1.650 | 102.3 |
| 31 | HfO2 | 2.100 | 10.7 |
| 32 | 70.6%SiO2-29.4%HfO2 | 1.640 | 101.9 |
| 33 | SiO2 | 1.460 | 180.0 |
| 34 | 74.7%SiO2-25.3%HfO2 | 1.614 | 107.8 |
| 35 | HfO2 | 2.100 | 7.6 |
| 36 | 76.7%SiO2-23.3%HfO2 | 1.601 | 104.5 |
| 37 | SiO2 | 1.460 | 182.7 |
| 38 | 79.0%SiO2-21.0%HfO2 | 1.588 | 117.7 |
| 39 | HfO2 | 2.100 | 6.1 |
| 40 | 82.3%SiO2-17.7%HfO2 | 1.567 | 108.2 |
| 41 | SiO2 | 1.460 | 178.2 |
| 42 | 83.8%SiO2-16.2%HfO2 | 1.558 | 115.5 |
| 43 | HfO2 | 2.100 | 5.1 |
| 44 | 82.0%SiO2-18.0%HfO2 | 1.568 | 125.0 |
| 45 | SiO2 | 1.460 | 97.7 |
|  | ADHESIVE |  |  |

* ABSORBING & DISPERSIVE, LAMBDA AT 500nm

FIG. 7.

ns="a" encoding='utf-8'?>
SOLAR CELL COVER AND COATING

BACKGROUND OF THE INVENTION

The present invention applies to the field of solar cell covers. Such covers comprise at least a substrate and a multilayer bandpass filter and usually also have an ultraviolet reflecting coating and a heat reflecting coating. The cover is cemented to a solar cell, and the multilayer bandpass filter is designed to pass almost all the solar radiation within the band of optical wavelengths to which the cell is sensitive. The transparent cement between the substrate and the cell darkens upon exposure to ultraviolet radiation and must be protected from such exposure. Therefore the substrate is preferably comprised of an ultraviolet absorbing material such as Pilkington's ultraviolet-absorbing CMX glass. The ultraviolet-reflecting coating augments the absorbing action of the substrate, and reduces the rate at which heat is delivered to the substrate by absorption. This coating is usually situated so that it is the first coating encountered by solar radiation traveling toward the underlying solar cell.

The multilayer bandpass filter is designed to reflect the near infrared radiation that lies immediately adjacent the sensitivity band of the solar cell and to be transparent throughout the sensitivity band. This requires that the filter have a wide transmission band that extends from the near infrared to the near ultraviolet. Pioneer work on multilayer bandpass filters for solar cells has been done by Thelen as taught in U.S. Pat. No. 3, 247,392 entitled Optical Coating and Assembly Used as a Band Pass Interference Filter Reflecting in the Ultraviolet and Infrared, U.S. Pat. No. 3, 423,147 entitled Multilayer Filter with a Wide Transmission Band, and U.S. Pat. No. 3,914,023 entitled Wide Band Multilayer Interference Filter.

Thelen's designs meet the above-noted requirements by suppressing higher order reflection bands that fall within the sensitivity band of the cell. Suppression of higher orders is achieved by unique designs in which individual layers are each comprised of material having an index of refraction characteristic of that layer, and where a particular layer may have one of three or more indices. The following material describes the principles underlying Thelen's inventions.

Optical interference filters often have periodic structure. The structure may be illustrated by a sequence of letters such as ABABABABAB where the letter A stands for one quarter wave optical thickness of material A at the design wavelength and the letter B stands for one quarter wave optical thickness of material B at the design wavelength. A short sequence which repeats within a long sequence is called a period. AB is a period within the above sequence and the sequence can be written $(AB)^5$, indicating that the sequence in constructed by repeating the period AB five times.

The sequence $(AB)^n$, where n is any number greater than one, is called a quarter wave stack. A quarter wave stack has the property that it reflects incident radiation at a fundamental or design frequency and at frequencies that are odd multiples of this frequency. The multiples are the orders of the refection. Thus the quarter wave stack has first, third, fifth orders of reflection and an infinite number of other orders corresponding to all the odd numbers. Since the wavelength of the reflected light is inversely proportional to its frequency, the wavelengths of the orders are proportional to the reciprocal of the odd numbers. In a quarter wave stack the frequency of the fundamental or first order is the same as the design frequency.

A quarter wave stack is not suitable for a solar cell cover. If the first order is placed at a position to block near infrared radiation, the resulting third would block visible light at the blue end of the spectrum. Thelen in U.S. Pat. No. 3,247,392 teaches a design that suppresses both the second and third order reflections. His design uses three materials, A, B and C in a sequence with the period ABCBA. In the practice of the invention the indices of refraction of the materials A, B, and C must be selected in accordance with a mathematical formula prescribed by Thelen. Thus, if materials A and B are selected, the index of refraction of C must have the value prescribed by Thelen's formula when the indices of A and B are substituted into it. Thelen found that for coating glass substrates, the materials magnesium fluoride, titanium oxide and lanthanum oxide gave satisfactory results and for quartz substrates, silicon dioxide should be substituted for lanthanum oxide. A third material having an index of approximately 1.96 is then selected.

In U.S. Pat. No. 3,423,147, Thelen teaches the use of three materials in a sequence with a period ABCCBA in order to suppress the second, third and fourth order reflections, thereby achieving a still wider transmission band. In this invention the indices of the materials are related by the formula $n_C^2 = n_A \times n_B$.

Thelen describes another wide band filter in which higher order reflections are suppressed in U.S. Pat. No. 3,914,023. This filter uses four materials, A, B, C, and D and the period is ABCDDCBA. Thelen gives a mathematical prescription for selecting the indices of refraction of the four materials and gives specific examples of materials that follow the prescription.

In the first of the patents cited, Thelen teaches the use of his coating on a solar cell cover and claims the use of the coating in this application. He also claims the cover with additional heat rejecting filters and UV rejecting filters, and additional assembly comprising a light-sensitive cell with a coated cover cemented to it.

In addition to his patents, Thelen has published numerous articles in which he describes the principles underlying his filters. See for example Thelen's paper entitled "Multilayer Films with Wide Transmission Bands", J. Opt. Soc. Am., 53,1266. In this paper Thelen describes the theoretical basis for his designs and shows how to design a filter which suppresses selected higher orders.

The coatings of Thelen's inventions which have been cited have the disadvantage that they require more than two materials to be deposited during a coating run. A second, and perhaps more serious disadvantage is that the inventions place constraints on the indices of refraction of the materials to be used in the coating. Materials which satisfy these constraints are not necessarily compatible with the requirements of a given application, so that the coating could not be used for that application.

Rancourt, in U.S. Pat. No. 4,229,066, describes a periodic multilayer coating which provides high reflectance at some IR wavelength (e.g. 10.6 $\mu$m) and transmits in the visible. Transmission in the visual is obtained by suppressing those high order reflections which lie in the visual band. The coating uses only two materials. It employs alternating thick H and L layers with ¼ wave optical thickness at the IR reflectance wavelength. Between these thick layers are AR layer sequences of thin H and L layers. The total optical thickness in the AR stacks is ¼ wave at the wavelength of transmission (e.g. 0.55 $\mu$m).

While Rancourt's invention avoids the use of a third material, the number of layers in a period in Rancourt's invention is 11 compared to 5 in a comparable filter designed according to Thelen's teaching. Thus the use of a material with a selectable index would provide a coating with performance of Rancourt's that would have many fewer layers.

U.S. Pat. No. 5,449,413 by Beauchamp et al. describes a solar cell cover as in Thelen's '392 patent. The cover comprises an ultraviolet reflector, an anti-reflection component and an infrared reflector; Beauchamp's infrared reflector being functionally the same as Thelen's coating for suppressing the second and third orders. The difference between Thelen and Beauchamp lies in the use by Beauchamp of only two materials in the infrared reflecting coating. This eliminates the constraints on indices imposed by Thelen. These constraints preclude the use of materials which are nonabsorptive in the entire spectral range of present day solar cells.

Beauchamp also claims "a means for suppressing low order reflections" as a characteristic of his infrared reflecting filter. The orders that his filter rejects include the second and third order reflections, and these are the same orders that are suppressed by Thelen. Use of the phrase "lower order" to describe the second and third orders as differentiated from the first order is highly unconventional. In any event Beauchamp's use of this terminology does not change the fact that his teaching with regard to order suppression is the same as that of Thelen and therefore has been anticipated by Thelen. Beauchamp is also anticipated by Rancourt, since Rancourt's design provides a means for suppressing higher orders that lie in the visible band.

Figure 1:
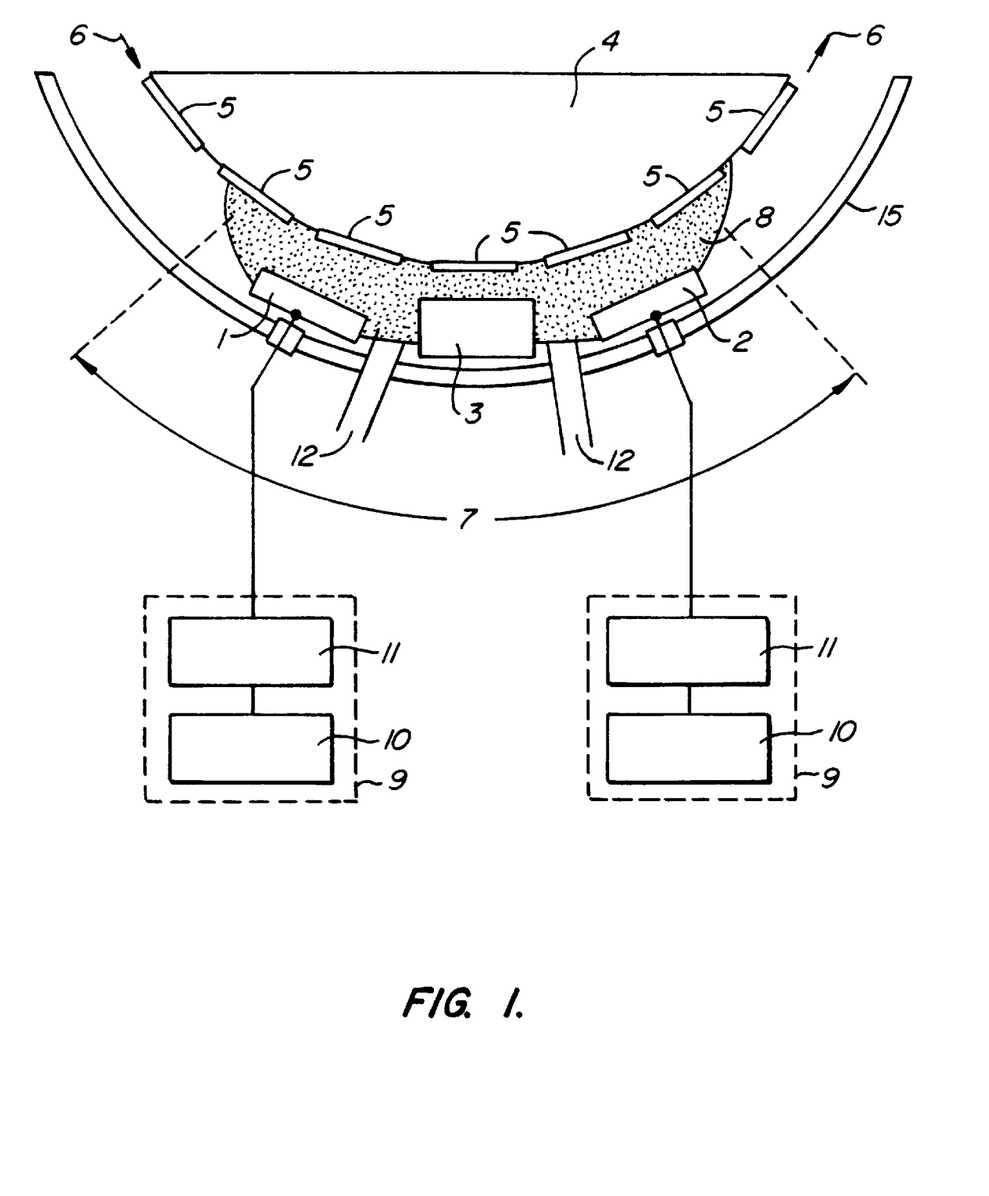
FIG. 1 is a section through a sputtering machine in which a coating having layers comprised of mixed materials is to be deposited as described in U.S. patent application Ser. No. 08/585759.

In U.S. patent application Ser. No. 08/585759, filed Jan. 19,1996, now abandoned Howard, et al., describe a process for sputtering a coating comprised of mixed materials in a "short throw" reactive sputtering process in which substrates are transported past one or more pairs of sputtering targets by a rotating drum. Sputtering and reaction take place within a single continuous reaction zone. FIG. 1 shows a section through a sputtering chamber 15, in which the process described in the application is to be carried out.

The sputtering chamber contains two targets 1 and 2 comprised of different materials such as silicon and niobium which are to be sputtered and at least one plasma generator 3. Substrates 5 are transported by a rotatable drum 4, so that they move in the direction of the arrows 6, transiting the sputtering station 7 and passing through the region 8 in which sputtering and reaction occur. The sputtering targets and the plasma generator are elongated in a direction perpendicular to the plane of the figure so as to cover the full width of the coating and reacting region. The electric power supplies for the sputtering targets are in this embodiment preferably selected from a class of power supplies which generate appropriately timed interruptions or reversals of the voltage being supplied to the targets. Two individual power supplies 9 are individually connected to the sputtering targets, each supply being comprised of a power generation unit 10 and a voltage reversal unit 11. Each power supply contains a feature that enables the power that it delivers to be maintained at a selectable level.

FIG. 1 shows two ducts 12 which represent a system of ducts that is used for the introduction of the working gas, such as argon and a reacting gas such as oxygen. The plasma generator causes an enhanced concentration of reactive species of the reacting gas to occur within the region 8 and thereby facilitates combination of the reacting gas with the deposited material.

When depositing a coating comprised of mixed materials, the power supplies attached to each of the targets are set to deliver amounts of power such that the deposition rates of the material from each of the targets are in the ratio that will produce the desired mixture. A high rate of deposition of the desired coating can be achieved by following the practices described in the application, which allow full compounding of material from both targets without target poisoning.

Using the teaching of the above application a bandpass filter for a solar cell can be fabricated in which all of the layers of mixed material have a different composition and index of refraction. Therefore the indices of these layers can be selected so as to optimize the performance of the filter. An optimized design may be realized using thin film design software which starts with a particular design and then systematically varies the design parameters while computing the performance of the design as it is varied. Prior art optimization varies only the thickness of the layers, whereas in the practice of the present invention both the thickness of the layers and the indices of the mixed layers can be varied.

Use of mixed materials in the multilayer coatings for a solar cell cover provides an increase in the rate of production of the covers in a given sputtering machine over the rate that is achievable when three materials are used. Fabrication using mixed materials as is taught in U.S. patent application Ser. No. 08585759 now abandoned requires that a sputtering station contain two targets, each of which is capable of sputtering a different material. Providing a plurality of such sputtering stations can increase the production rate of a particular sputtering machine so that the rate of deposition of the machine is increased approximately in proportion to the number of stations. In a process involving the deposition of three or more pure materials, a sputtering station would contain targets capable of sputtering each material, so that the station would contain three or more targets. Thus a given station would occupy more space when pure materials are used in the coating than when mixed materials are used. Thus, a larger number of stations can be situated within a given sputtering machine, implying that a high production rate is achievable using mixed materials in a coating than when using pure materials.

Use of mixed materials results in fewer layers for equivalent performance. Fewer layers requires less time for coating because of less lost time due to changeover from one material to another for each consecutive layer.

It is an object of this invention to provide a solar cell cover with a bandpass interference filter, reflecting in the ultraviolet and infrared, which is not subject to the constraints of the Thelen invention.

It is further object of the invention to provide a multilayer stack which implements the Thelen inventions by means of periods comprised of layers, wherein at least one layer has a selectable index.

It is a still further object of this invention to provide a coating in which the index of refraction of each layer of mixed material has a particular selected value, and the value is selected so as to optimize the performance of the filter.

It is still a further object of the invention to reduce the number of sputtering targets within a sputtering station compared to the number required when pure materials are used, thereby enabling a greater increase in production of a particular machine by employing a plurality of stations.

It is a still further object of this invention to reduce the number of layers in a multilayer bandpass interference filter with a give spectral performance.

It is a still further object of this invention to provide a coating for a solar cell in which layers of pure materials and mixed materials are stacked, thereby reducing stress in the coating and achieving enhanced durability of the coating.

BRIEF DESCRIPTION OF THE INVENTION

The invention consists of a solar cell cover comprised of at least a substrate and a multilayer bandpass filter. It also preferably includes a heat reflecting filter, an ultraviolet reflecting filter, and antireflection coatings in the transmission band. The pass band of the multilayer bandpass filter is substantially the same as that of the solar cell to which it will be attached.

The present solar cell cover differs from prior art in that the bandpass filter has layers whose individual indices of refraction have three or more values, while being fabricated using only two sources of coating material. The materials are chosen to have good transmission in the entire spectral range of the solar cell. One material H has a high index of refraction and the other L has a low index. The layers of the coating, which are not comprised of either pure H or pure L, are fabricated by depositing a mixture of H and L when forming those layers. These layers, which have indices that are intermediate between the indices of H and L are referred to as "mixed layers".

If a bandpass filter which suppresses the second and third orders is required, a starting point for the design is the order-suppressing filter taught by Thelen which performs the same function. In this example the multilayer is periodic with period ABCBA. The materials A and C are selected to have desirable optical and mechanical properties and the index of B, which is intermediate between that of A and B, is computed from the indices of A an C according to Thelen's prescription. The spectral performance of this design is then computed using values of the refractive indices that account for absorption and dispersion. The resulting starting design may then be subjected to a process known as "optimization" in which the performance is improved by systematically varying the thickness of each layer and the index of each mixed layer until further variation produces no further improvement.

In prior art only the thickness of each of the individual layers is varied. The present invention differs from prior art in that it employs, for the first time, a process of design optimization using small variations of both the thickness of each layer and the indices of refraction of each mixed layer of the coating. This is possible because layers of mixed material can be selected to have any values between those of their constituent materials. Optimization by variation of indices as well as the thickness permits higher levels of performance using a given number of layers than optimization by variation of layer thickness only.

The optimization process determines the required index of each of the mixed layers. The proportion in which the two materials are to be mixed in order to give the required index of each layer is then computed. The layers are then fabricated by a sputtering process such as is described in U.S. patent application Ser. No. 08585759 in which each mixed layer is caused to have the required composition by selectively controlling the deposition rates of the two materials.

The present invention removes the constraints on the choice of coating materials, since the two materials having a high and low index can be freely elected, and a layer of mixed material having any desired intermediate index can be fabricated according to the invention. This invention provides significant reduction in the number of layers required in a multilayer bandpass filter for a solar cell compared to the number required when layers having only two indices are used.

DETAILED DESCRIPTION OF THE INVENTION

As previously mentioned, the solar cell cover of this invention is comprised of the same functional units as is the prior art solar cell cover of U.S. Pat. No. 3,247,392 by Thelen. These elements include at least a multilayer bandpass filter and a substrate and preferably an ultraviolet reflecting filter, a heat reflecting filter and anti-reflection filters. In this invention the multilayer bandpass filter is a novel filter of unique design in which some of the layers are formed from pure materials having high and low indices of refraction, and other layers having indices that are intermediate between the indices of the pure materials are comprised of a mixture of the pure materials.

In the practice of the present invention one of the designs of Thelen may be used as a starting point. The design is then modified by a process called "optimization" in order to bring the coating performance closer to that desired. In prior art optimization procedures the thickness of each layer is varied about its design value while the performance is monitored. Variation is continued until the best performance is achieved. In the practice of this invention, the index of refraction of each mixed layer can be varied also. By varying both indices of refraction and thickness, better performance with a given number of layers is possible than is available using prior art.

As previously noted, the design of a filter for suppression of the second and third reflection orders uses as a starting point for optimization a periodic multilayer with period LMHML. The letters L and H stand for layers of material having low and high indices respectively, and M is a mixed layer having an intermediate index. The index of M can be calculated from the indices of L and H according to the formula given by Thelen.

A second example where a wider transmission band is required is Thelen's design for suppressing the second, third and fourth orders as taught in U.S. Pat. No. 3,423,147. This approach starts with a stack having the period LHMMHL, where, as before, the index of M is calculated from the indices of L and H.

Note that the capital letters used in describing the second example do not stand for the same materials or mixtures when applied to the first example. The materials L and H represent any two materials selected by the designer for a particular application, and M is a mixture of L and H, whose index depends on the indices of L and H.

Other coatings where materials having more than one index are required may be used as a starting point. For example, Thelen's technique for suppressing higher orders, as taught U.S. Pat. No. 3,914,023 describes coatings having the period ABCDDCBA where the indices of A, B, C and D are related by a mathematical formula. Where higher order suppression as taught in this patent is required, the above period could be used as a starting point. The H and L materials would be selected to have the desired properties. The indices of the two mixed layers would be calculated according to Thelen's teaching, and the resulting design would be optimized by varying the thickness of each layer and the indices of the mixed layers.

The following example is directed to a multilayer bandpass filter to be used in a space application as a cover for a silicon cell. The filter is to be mounted on a glass cover slip on the side that is to be cemented to the cell. The index of the glass is 1.5 and the index of the cement is 1.4.

Two coating materials are required which are transparent in the silicon spectral response range from 400 to 1100 nm and which are space qualified; hafnia and silica have been selected for the H and L layers. The indices of these materials at 500 nm are 2.10 and 1.46 respectively.

The figures that follow give the results of calculations that were made using a commercially available software package called Film Wizard™ produced by Scientific Computing, Inc. This software was used to compute the spectral transmission of FIGS. 2 and 3 and to introduce the dispersion and absorption of real materials in order to obtain FIG. 4. It was also used to obtain the optimized designs given in FIGS. 5, 6, and 7. After the required indices of the mixed materials had been determined by optimization, the software was used to compute the proportions of materials needed to generate the required indices.

Figure 2:
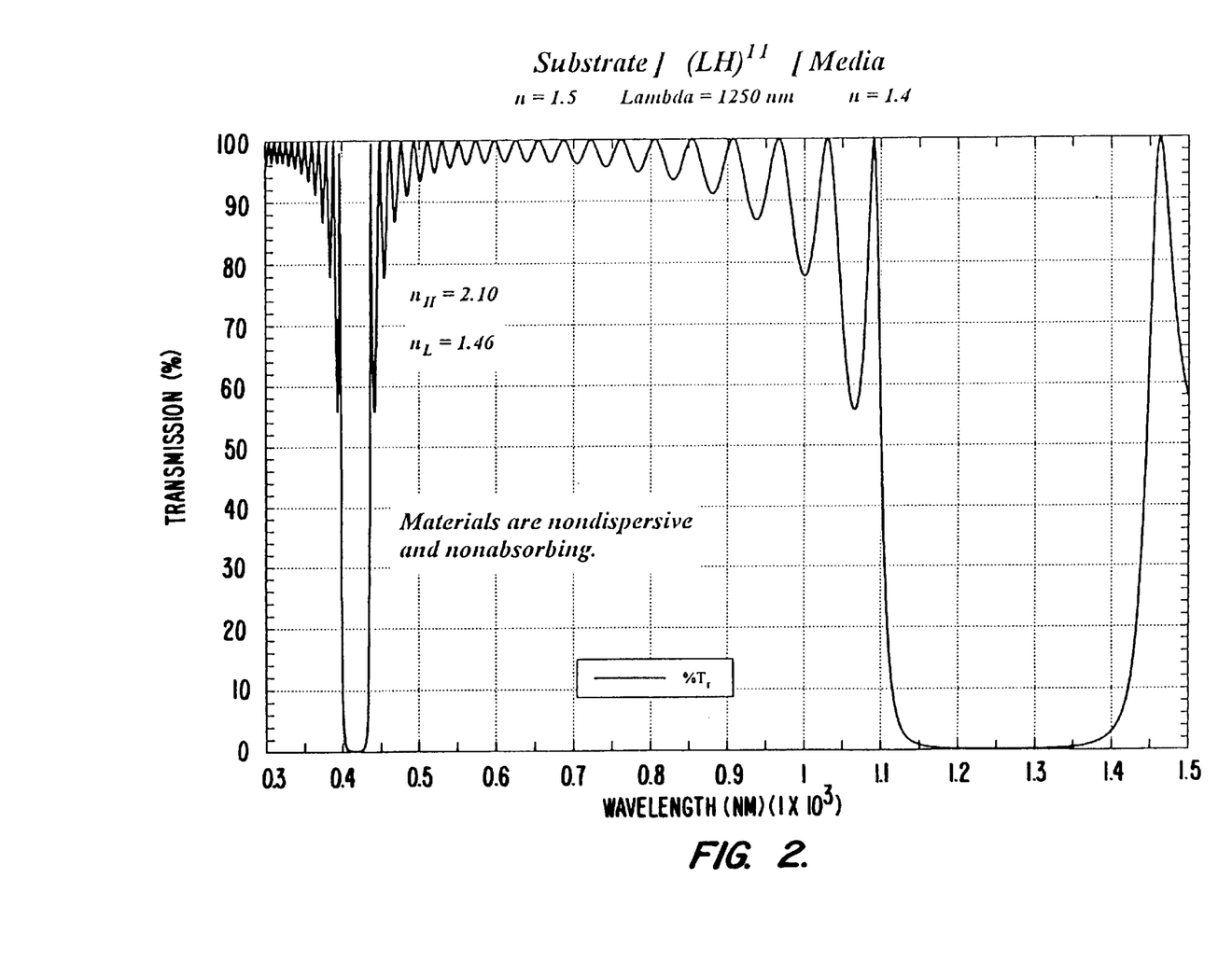
FIG. 2 is a spectral transmission curve for a quarter wave stack having 11 periods

FIG. 2, included for purposes of comparison, shows the spectral transmission of an eleven period quarter wave stack comprised of hypothetical non-dispersive materials that have the same indices that silica and hafnia have at 550 nm. The design wavelength was 1250 nm. As the figure shows, the spectral transmission of the stack has a first order reflection band centered at 1250 nm. As indicated previously, however, the quarter wave stack reflects the third order, which is centered at 1250/3 or 417 nm. The third order reflection falls within the desired transmission band, and is therefore unacceptable.

To overcome the shortcomings of the quarter wave stack, of FIG. 2, a filter that suppresses both the second and third orders is required. As previously shown, such a filter can be constructed by a sequence $(LMHML)^n$, where L stands for a layer of silica, H stands for a layer of hafnia, and M is a layer comprised of a mixture of silica and hafnia. The proportions of silica and hafnia in the mixture must give the prescribed value for the index of M. In the present example this filter is used as a starting point for optimization.

The required value for the index of M is determined by solving the formula presented in Thelen's U.S. Pat. No. 3,247,392 for $n_M$. The formula is $$0.94722 = (n_L n_M - n_H^2)/(n_M^2 - n_L n_H^2/n_M)$$

where $n_L$, $n_M$, and $n_H$ are the indices of silica, the required mixture of silica and hafnia, and hafnia, respectively. When the values of the indices of hafnia and silica at 550 mm are substituted into the formula and the resulting expression is solved for $n_M$, the required index is determined to be 1.83. A suitable layer M can be formed by sputtering silica and hafnia using a reactive sputtering system as taught in applicant's U.S. application Ser. No. 08585759.

Figure 3:
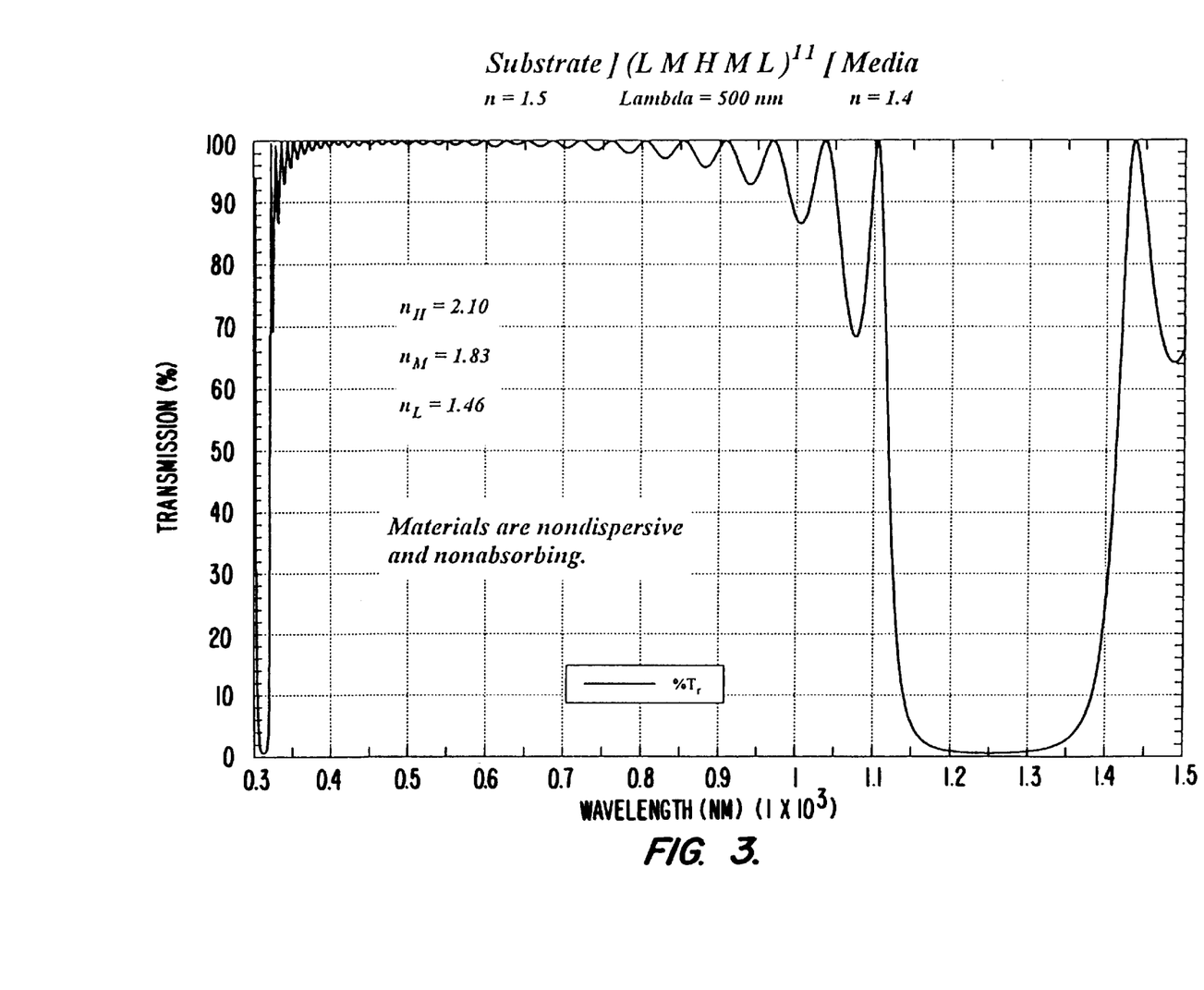
FIG. 3 is a calculated spectral transmission curve of a periodic bandpass filter comprised of layers of materials having indices of refraction of 1.46, 1.83, and 2.10. The filter suppresses the second and third order reflections. Absorption and dispersion have been neglected.
Figure 4:
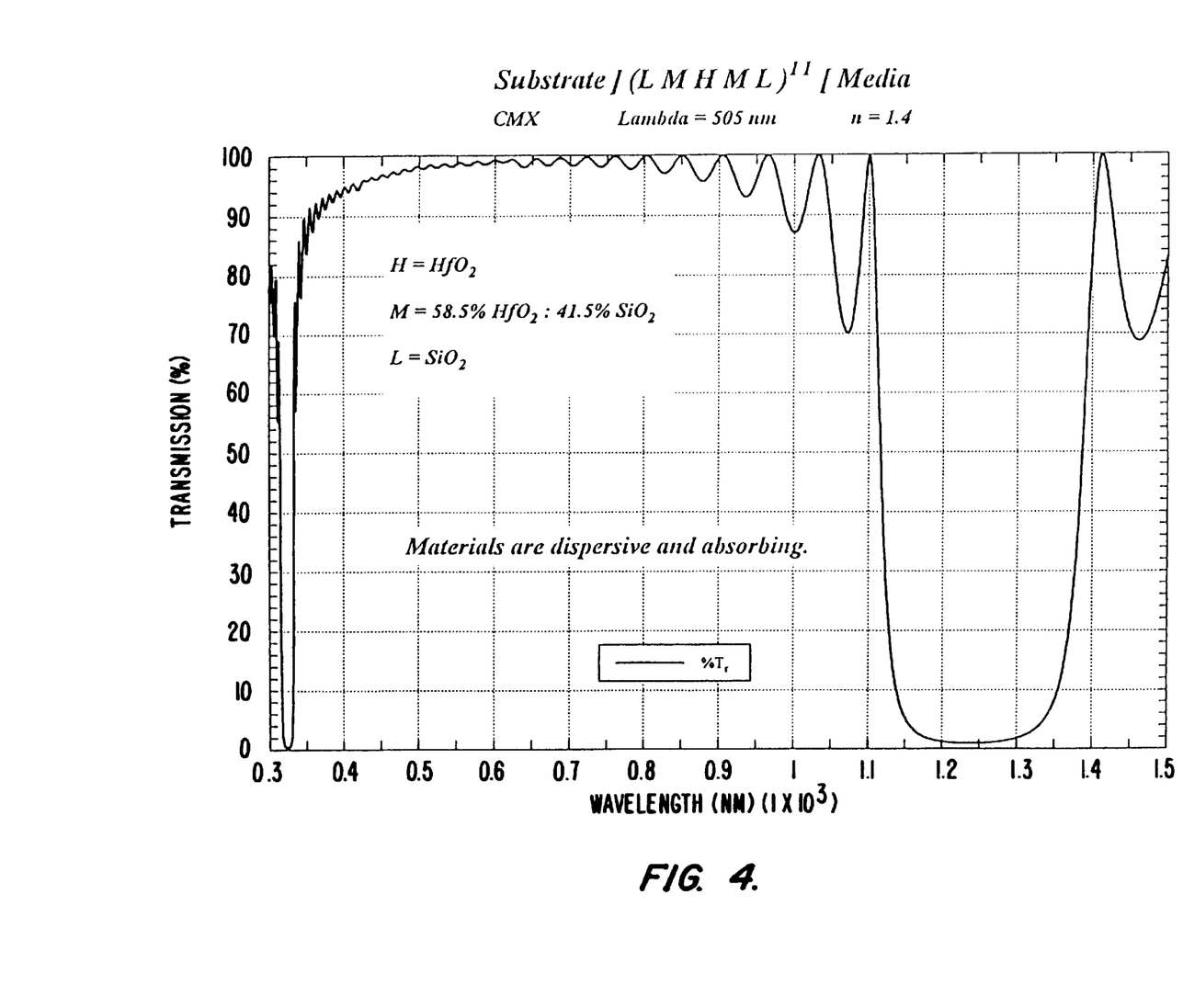
FIG. 4 is a calculated spectral transmission curve of the design of FIG. 3 using the characteristics of real materials. The materials are silica, a mixture of silica and hafnia and hafnia. These materials have indices of 1.46, 1.83 and 2.10 at 550 nm respectively, The effects of absorption and dispersion have been included.

FIG. 3 is a computed spectral response curve of the stack $(LMHML)^{11}$ using the values 1.46, 1.83 and 2.1 for the indices $n_L$, $n_M$, and $n_H$. The third order at 417 nm is suppressed and the fourth order, which is at 312.5 nm is the lowest order present. This order lies outside the desired transmission band of the filter, indicating that the design is acceptable.

FIG. 3 was prepared assuming that the materials were non-absorptive. The materials were also assumed to have the same index over the entire wavelength band; that is, they were assumed to be non-dispersive. In preparing FIG. 4 the dispersion and absorption of silica, hafnia and the mixture were taken into account by using in the calculation indices that were complex numbers that varied with wavelength. The variation of the indices reflected the behavior of materials deposited in an actual sputtering process such as is described in the above-mentioned patent application. The effect of absorption and dispersion was to allow slightly more transmission in the fundamental reflection band at 1250 nm, while reducing the transmission in the near ultraviolet portion of the transmission band.

The optimization process was used to improve the performance of the filter. The first step in the optimization was to specify an ideal filter performance. For the multilayer bandpass filter, reflectance at wavelengths longer that the long wave cutoff of the solar cell at 1100 nm, and transmission from 400 to 1100 nm were to be maximized. Reflection in the ultraviolet was not critical since a separate ultraviolet-reflecting filter was assumed to be present.

The optimization process of the practice of the present invention takes advantage of the ability to obtain individual layers having any value within a range of values that is provided by the present invention. Thus the indices of all the mixed layers can be optimized as well as the thickness of the layers. In prior art optimization only the layer thicknesses are varied. Since optimization by the present invention allows more parameters to be changed, it produces designs having better performance than prior art optimization.

Figure 5:
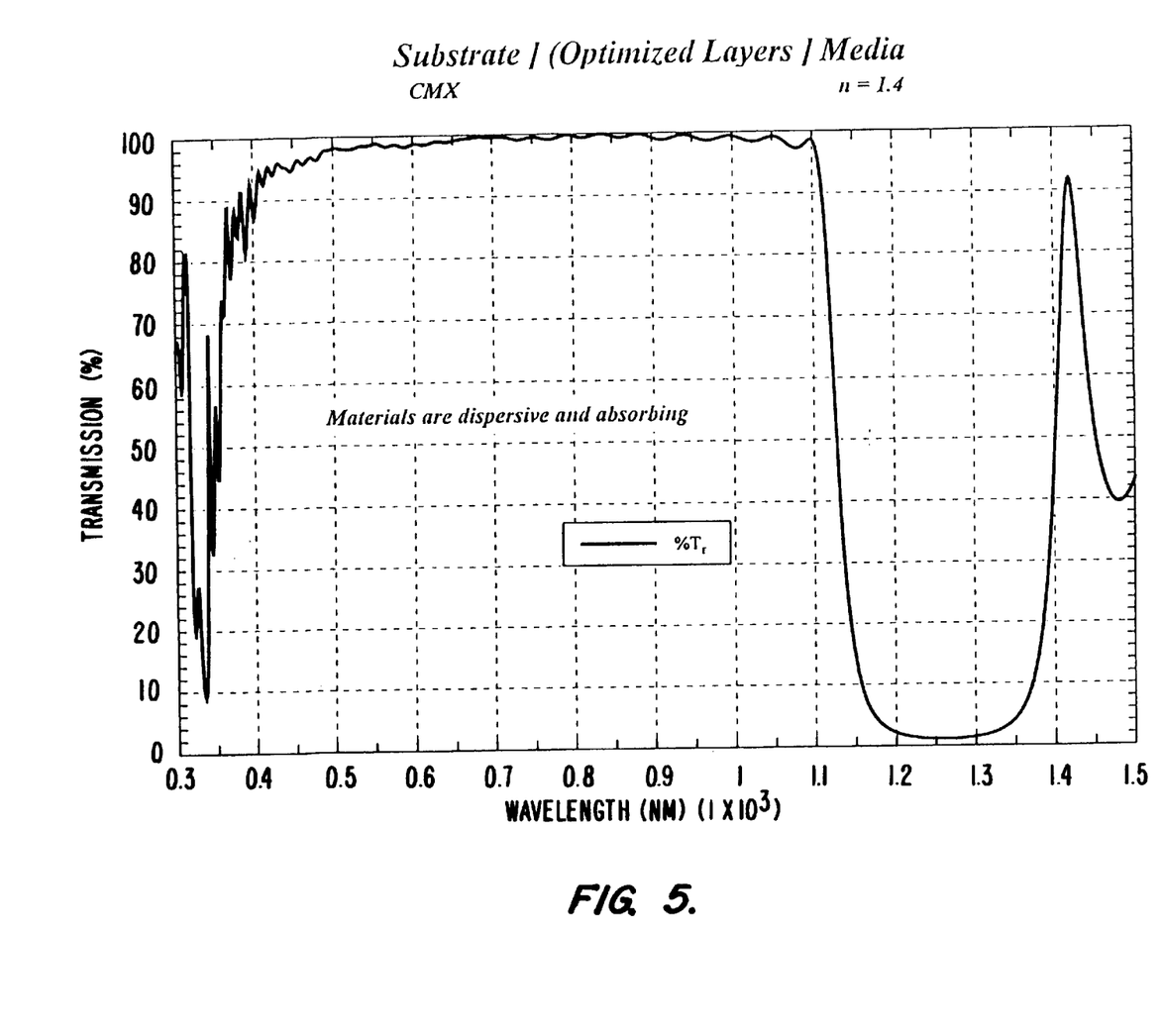
FIG. 5 is a calculated spectral transmission curve of a design which resulted when the design of FIG. 4 was optimized according to prior art by varying the thickness of each layer.

FIG. 5 shows the resulting spectral performance when the design is optimized according to prior art. The design of FIG. 4 was taken as a starting point and small variations of the thickness of each layer were made while the coating performance was monitored. The performance was continuously compared with the desired performance, and variation continued until no additional performance improvement could be achieved. Optimization then stopped and the resulting layer parameters after variation were taken for the final design. By comparing FIG. 5 with FIG. 4 it may be seen that the optimization process has increased transmission in the near infrared adjacent the reflection band at 1250 nm. The fourth order reflection in the ultraviolet is somewhat reduced in the optimized design since in the ideal ultraviolet reflection was not critical. The optimization process therefore sacrificed ultraviolet reflection for higher in band transmission.

Figure 6:
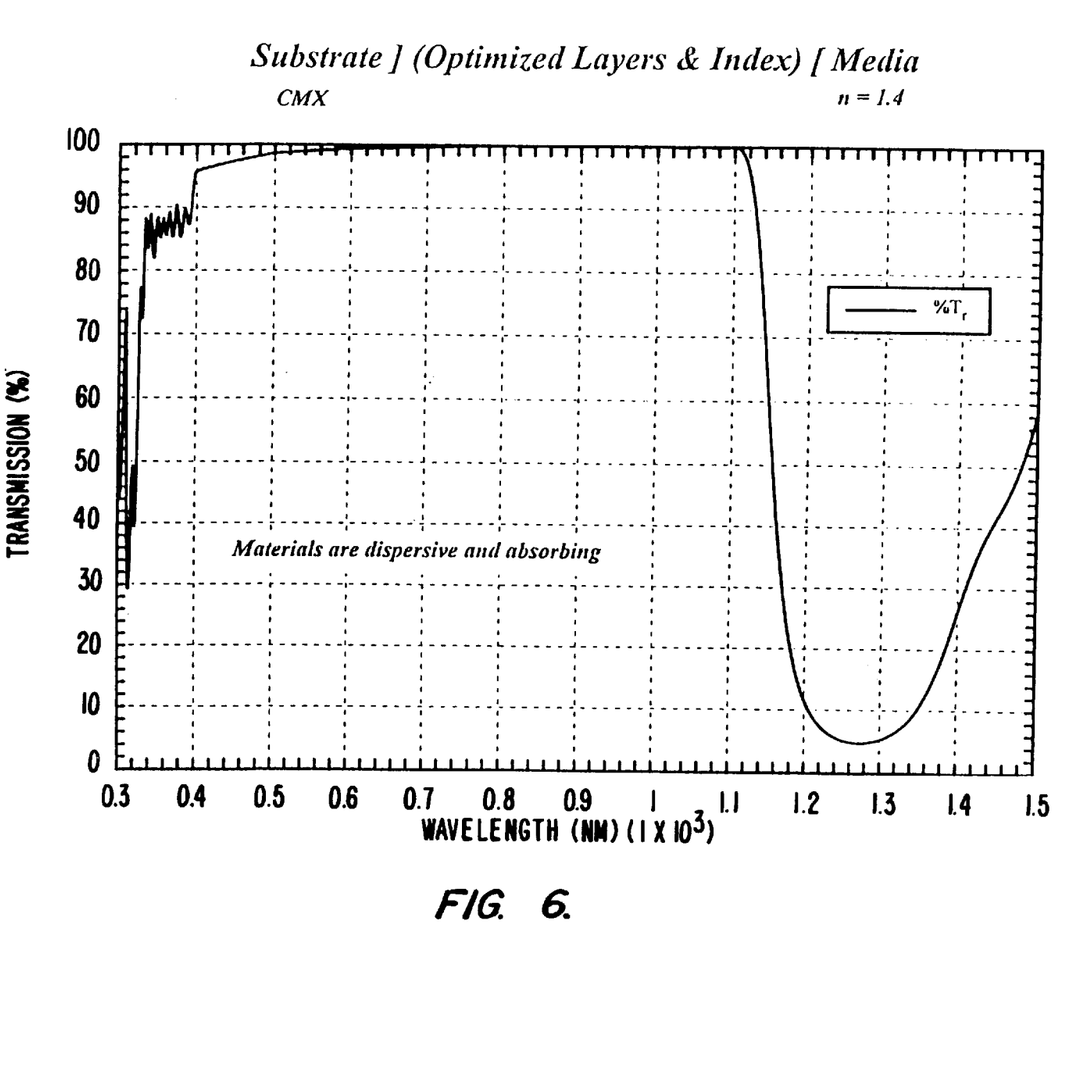
FIG. 6 shows the calculated spectral transmission of a design which resulted when the design of FIG. 4 was optimized according to the practice of the present invention by varying the thickness of each layer as well as the index of each mixed layer.

FIG. 6 shows the spectral transmission of a filter which the same design as a starting point, and the same optimization criteria that were used in generate FIG. 5. In the case of FIG. 6, however, optimization was carried out according to the present invention by varying the individual indices of all the mixed layers as well as the thickness of each layer. When FIG. 6 and FIG. 5 are compared, the advantage of index variation becomes apparent. Improvement is realized by the present invention in both the transmission band from 400 to 1100 microns and the infrared reflection band from 1100 to 1500 nm. Improvement in infrared reflection performance is especially pronounced. Variation of the index of the mixed layers has eliminated the transmission zone in the prior art design centered at approximately 1.41 nm.

Figure 7:
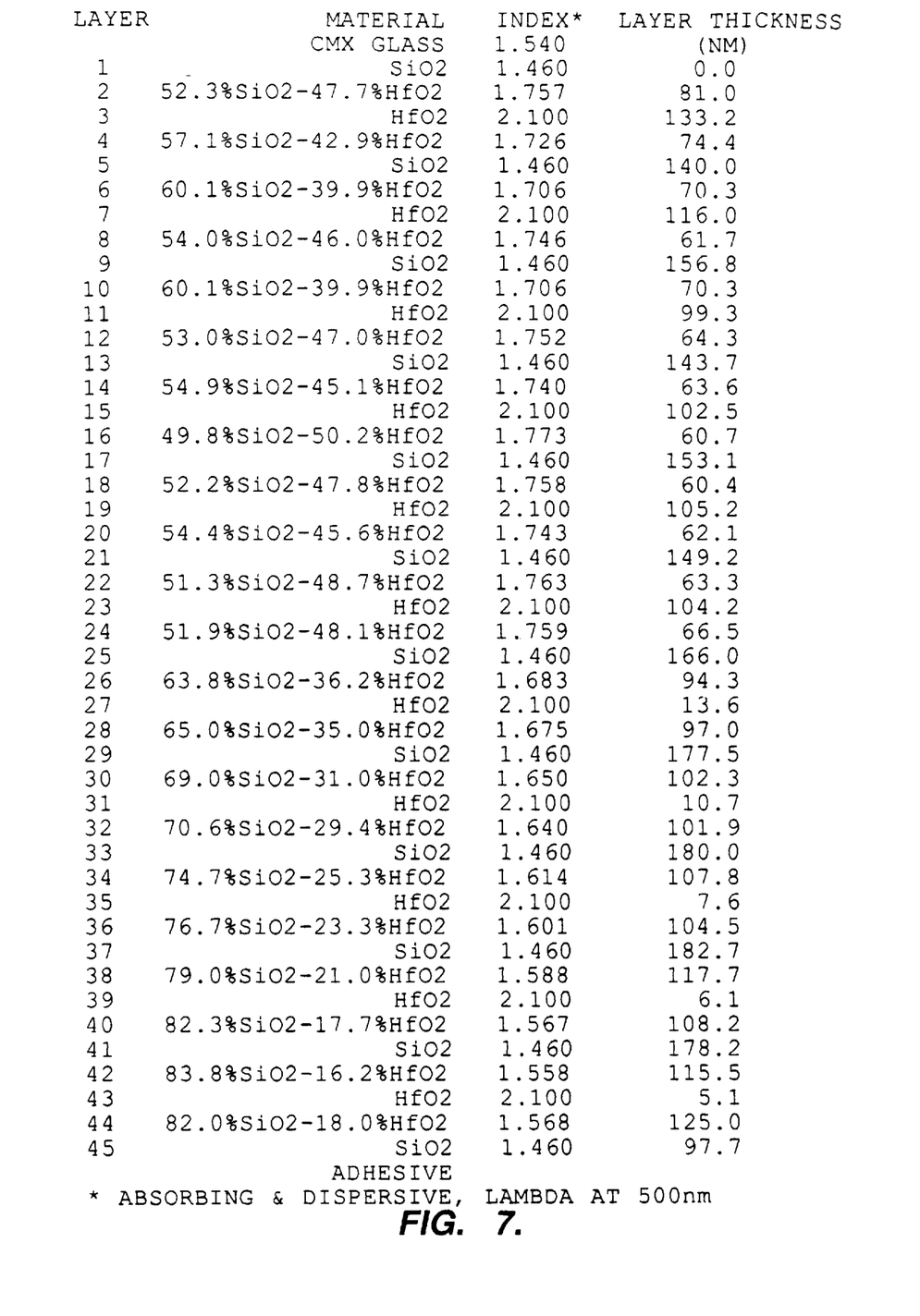
FIG. 7 is a table which gives the characteristics of the individual layers comprising the design of FIG. 6.

FIG. 7 is a table showing the characteristics of all the layers in the design of the present invention than provides the spectral performance shown in FIG. 6. The coating is located on the side of the substrate opposite the solar cell from the incident illumination. The first column gives the layer number, and the second column gives the composition of each layer including the substrate and the material that bonds the coating to the solar cell. The substrate was assumed to be ultraviolet absorbing CMX glass (the glass absorption is not shown in FIG. 6), and the cell cover was assumed to be bonded to the solar cell on the coating side by adhesive having an index of 1.4. Column 3 gives the real part of the index of each layer at 500 nm and the fourth column gives the layer thickness.

In a second example in which the fourth order is also suppressed, the pre-optimization design for the band pass filter takes the form $(LMHHML)^n$ and the relation between $n_L$, $n_M$, and $n_H$ is $$n_M^2 = n_L \times n_H$$

For this stack the index of M is required to be 1.75 so that a smaller proportion of hafnia would be present in the mixed layers of the initial design of the second example than in that of the first. The initial design is corrected for dispersion and then optimized as above by varying the indices of all the M layers as well as the thickness of each of the layers.

Our invention provides an advantage in balancing the stresses produced by the coatings. Because the solar cell cover for space application must have very little weight, it is made as thin as is practical. Thus a relatively small imbalance in the stresses by coatings on the two sides of the cover on the will cause unacceptable bending. Balancing of stress is therefore critical in designing the coatings for a solar cell cover.

An advantage of our coating is that it may be fabricated from two materials which not only have the required optical properties but which also produce a coating which is favorable for balancing stress. Once the L and H materials have been selected, the index of refraction of the mixed layer, its thickness and its composition are determined by methods which have been described earlier. The thickness and composition of the layers are important factors in determining the stress which will be induced in the solar cell cover when the coating has been deposited on it. It is therefore possible to choose materials that produce stress falling within a desired range. This freedom of choice helps in designing a solar cell cover in which the stresses induced on either side of the cover are balanced.

Another advantage of our invention stems from its ability to control the interfaces between layers so that at the interfaces the composition of the multilayer changes smoothly rather that suddenly. The ability to mix materials makes this possible. For example, suppose that a design calls for a structure $(ABMBA)^n$. In a prior art deposition process for producing the coating, the layers AB would be deposited by first depositing material A and then depositing a layer B on top of it. In the practice of the present invention, the layer A and B may be deposited in a continuous process during which the layer A is first deposited, and then a short transition zone follows. In the transition zone the composition is caused to vary smoothly from A to B. Similar transition zones are produced between B and M, M and B, and B and A. The smooth blending of the layers is beneficial in that it reduces the tendency of layers to delaminate under severe environmental conditions and thereby increases the mechanical durability of the coating.

While the design example used silica and hafnia as low and high index materials, mixtures of other materials may be used as well. Silica is probably the most suitable low index material that is available. Other materials such as niobia, tantala, or zirconia could be used as the material having the higher index.

We claim:

1. An optical ultraviolet and infrared coating for a solar cell cover, said coating is disposed on a substrate and is characterized as having a spectral response for transmitting solar energy within a band of wavelengths to which a solar cell is sensitive and promoting reflection of solar energy on either side of said band of wavelengths, said coating comprising a repeating pattern of layers of materials formed of two different materials H and L wherein materials H and L are characterized as having high and low indices of refraction and transmitting of solar energy within said band of wavelengths to which the solar cell is sensitive and a layer consisting of material M which consists of a homogeneous mixture of materials H and L and displaying an index of refraction between the indices of materials H and L.

2. The coating of claim 1 wherein said materials H, M and L are arranged to have a periodicity of LMHML and wherein each of said materials is characterized as having an optical thickness of substantially one quarter of a predetermined wavelength.

3. The coating of claim 2 wherein the indices of refraction of said three materials H, M and L are $n_H$, $n_M$ and $n_L$, respectively and the relationship between indices of refraction is defined by the equation $$0.94722 = (n_L n_M - n_H^2)/(n_M^2 - n_L n_H^2/N_M)$$

4. The coating of claim 1 wherein said repeating pattern is characterized as suppressing high order reflection within said band of wavelengths to which said solar cell is sensitive.

5. The coating of claim 1 wherein said H material is hafnia having an index of refraction $n_H$ of 2.10 and said L material is silica having an index of refraction $n_L$ of 1.46 measured at 500 nm.

6. The coating of claim 1 wherein said materials H, M and L are arranged to have a period icity of LMHHML wherein the relationship between the indices of the respective layers $n_H$, $n_M$ and $n_L$ is $n_M^2 = n_L \times n_H$.

7. The coating of claim 1 wherein said coating comprises a multilayer bandpass filter exhibiting high reflectance at 1250 nm and high transmission from 400 to 1100 nm and high reflectance at wavelengths shorter than 400 nm in the near ultraviolet region of the spectrum.

8. The coating of claim 1 further comprising an ultra violet reflecting filter.

9. A solar cell cover for residing between a solar cell and a source of radiation, said solar cell cover comprising a substrate transparent to radiation to which the solar cell is sensitive and an optical ultraviolet and infrared reflective coating disposed on said substrate, said coating being characterized as having a spectral response for transmitting solar energy within a band of wavelengths to which a solar cell is sensitive and promoting reflection of solar energy on either side of said band of wavelengths, said coating comprising a repeating pattern of layers of materials formed of two different materials H and L wherein materials H and L are characterized as having high and low indices of refraction and transmitting of solar energy within said band of wavelengths to which the solar cell is sensitive and a layer consisting of material M which consists of a homogeneous mixture of materials H and L and displaying an index of refraction between the indices of materials H and L.

10. A method of optimizing an optical ultraviolet and infrared reflective coating for a solar cell cover, said method comprising optimizing said coating's spectral response for transmitting solar energy within a band of wavelengths to which a solar cell is sensitive and promoting reflection of solar energy on either side of said band of wavelengths said coating comprising a substrate and a repeating pattern of layers of materials H and L wherein materials H and L are characterized as having high and low indices of refraction and transmitting of solar energy within said band of wavelengths to which the solar cell is sensitive and a layer consisting of material M which consists of a homogeneous mixture of material H and L and displaying an index of refraction between the indices of materials H and L whereby optimizing said coating's spectral response is carried out by varying thicknesses of layers H, L and M and the index of refraction of the layers M.

* * * * *